United States Patent

Yach et al.

[11] Patent Number: 5,835,410
[45] Date of Patent: Nov. 10, 1998

[54] SELF TIMED PRECHARGE SENSE AMPLIFIER FOR A MEMORY ARRAY

[75] Inventors: Randy L. Yach, Phoenix; Richard L. Hull, Chandler, both of Ariz.

[73] Assignee: Microchip Technology Incorporated, San Jose, Calif.

[21] Appl. No.: 871,340

[22] Filed: Jun. 9, 1997

[51] Int. Cl.$^6$ .................................................. G11C 16/06
[52] U.S. Cl. ............................. 365/185.21; 365/185.25; 327/51
[58] Field of Search ................... 365/185.21, 185.25; 327/51

[56] References Cited

U.S. PATENT DOCUMENTS

| | | | |
|---|---|---|---|
| 5,477,484 | 12/1995 | Nakashima | 365/182 |
| 5,642,313 | 6/1997 | Ferris | 365/185.25 |
| 5,671,186 | 9/1997 | Igura | 365/203 |
| 5,675,535 | 10/1997 | Jinbo | 365/185.2 |

*Primary Examiner*—David C. Nelms
*Assistant Examiner*—Hoai Ho
*Attorney, Agent, or Firm*—Harry M. Weiss; Jeffrey D. Moy; Harry M. Weiss & Associates, P.C.

[57] ABSTRACT

A self timed precharge sense amplifier for allowing high speed reading of a memory cell of a memory array. The self timed precharge sense amplifier uses a precharge device for generating an output voltage which is used to ramp up a voltage level of a column of the memory array where the memory cell is located. State control circuitry is coupled to the precharge device for activating and deactivating the precharge device. A sense amplifier is coupled to the precharge device and to the state control circuitry for monitoring the output voltage of the precharge device and for signalling the state control circuitry to deactivate the precharge device when the output voltage has reached a threshold voltage level set by the sense amplifier which is a minimum amount of voltage required to properly read the memory cell.

18 Claims, 1 Drawing Sheet

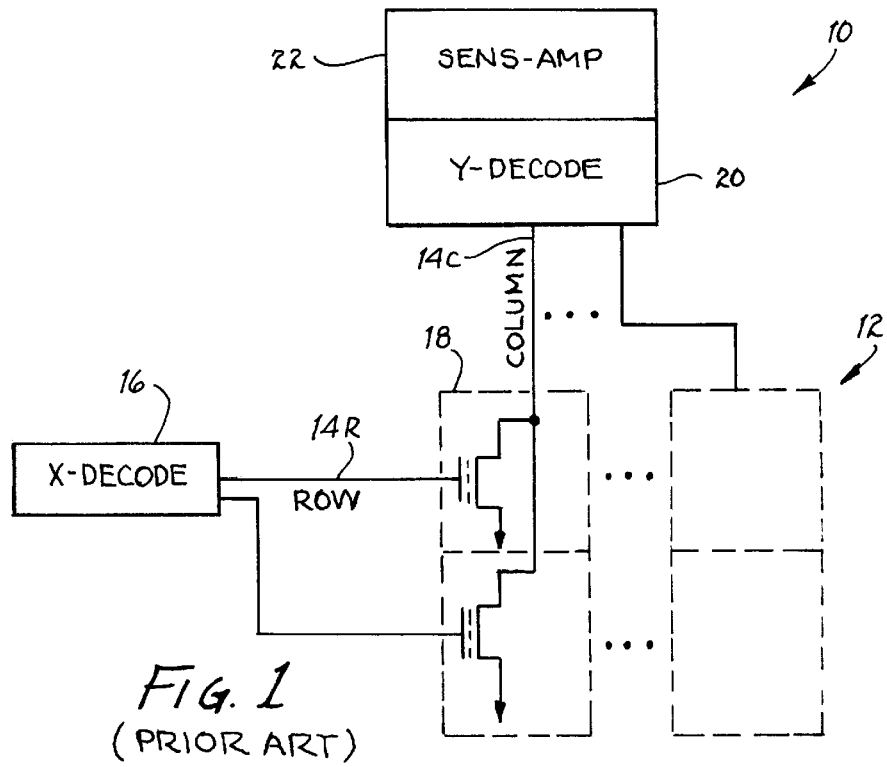
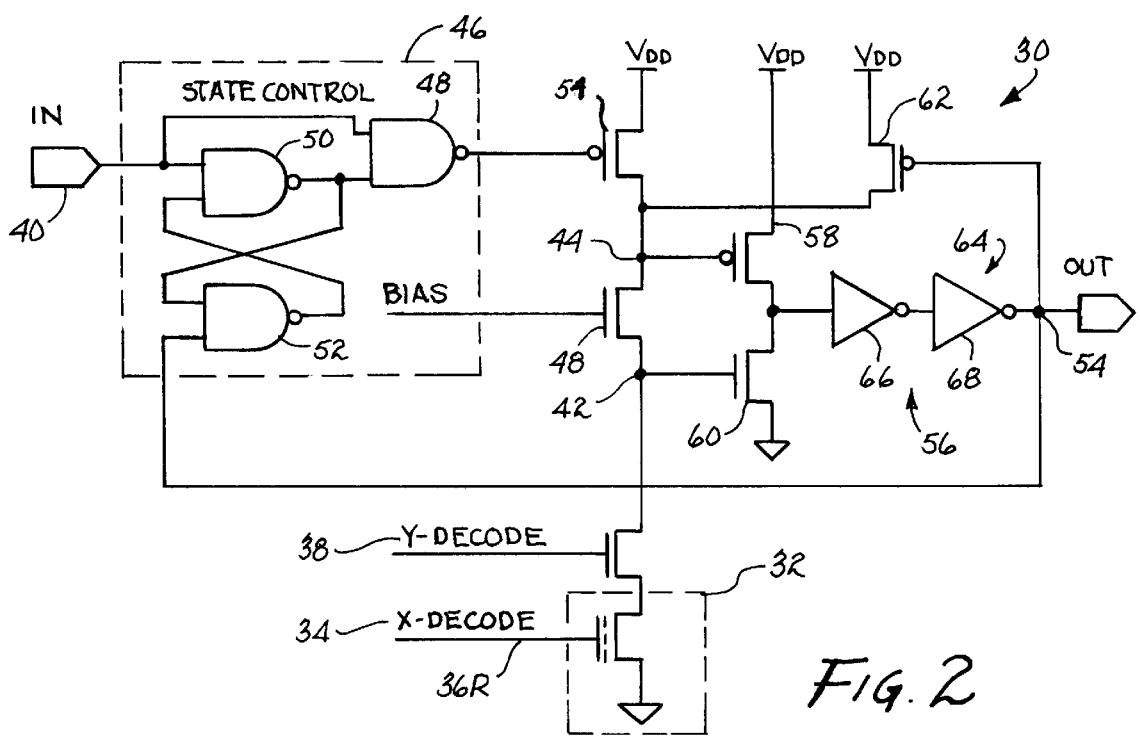

SELF TIMED PRECHARGE SENSE AMPLIFIER FOR A MEMORY ARRAY

BACKGROUND OF THE INVENTION

1. Field of the Invention

This invention relates generally to memory arrays and, more specifically, to a self timed precharge sense amplifier for allowing high speed reading of a memory cell of a memory array

2. Description of the Prior Art

Memory devices are fabricated using semiconductor process technology. As line widths are reduced in progression of the process technology, it may be desirable not only to design and fabricate entirely new versions of the products, but to "shrink" or scale existing products to smaller sizes with the new technology. This requires a review and analysis of the design and architecture of the product and the manner in which the attempted scaling of its size may adversely affect its operation.

In general, in order to read the data of a memory cell in a memory array, a measurement of the programmed threshold voltage of the memory element is required. The memory cell is said to be erased if the threshold voltage of the memory cell is low, and to programmed if the threshold voltage is high. The cell is read by applying a voltage to the control gate of a transistor comprising the memory cell. If the applied voltage is higher than the threshold voltage, current flows through the memory cell. The programming margin of the memory cell is the voltage difference between the maximum applied control gate voltage and the programmed threshold voltage of the programmed memory cell. A programmed memory cell will not conduct current when read by application of a control gate voltage of a lower magnitude than the high threshold voltage of the memory cell.

In most implementations, the control gate voltage used to read the memory array is the supply voltage of the system. If the programmed threshold voltage of the memory cell is lower than the maximum value of the supply voltage, a programmed memory cell cannot be detected using the classic technique.

Scaling memory devices to smaller sizes has the effect of reducing the voltage range at which the memory devices operate. When a memory device is shrunk, the programmed threshold voltage of the memory cell is decreased and the effective programming margin is lowered. Furthermore, a smaller memory cell typically dictates a lower read current. These circumstances make it extremely difficult to read the data in a scaled memory cell by means of standard techniques.

Another problem in scaling the memory array and adding a voltage regulator necessary to achieve an adequate control gate voltage is that the resulting time required to read the memory array while consuming low current is very long in a classic implementation. By way of example, a memory element is read by first decoding the column using a Y-decoder. The column is then driven all the way to a high level $V_{DD}$ by using a sense amplifier. The row where the memory cell is located is then driven high by using an X-decoder. This takes a finite amount of time due to the number of transistors on the row. The sense amplifier will then detect the memory element pulling the column to a low level.

Typically, memory reads are controlled with clocking circuitry which takes time and burns current. The sense amplifier and the X-decoder are both run off of the system clock. However, the sense amplifier and the X-decoder run out of sync with one another such that when one is on, the other is off. This waste alot of time since no other activity is being performed during the precharge and the memory cell is precharged all the to a high level $V_{DD}$. Furthermore, time is also wasted since after the memory element is precharged, the memory cell waits until the read signal is activated.

Therefore, a need existed to provide an improved precharge circuit. The improved precharge circuit is a self timed precharged circuit. The self-timed precharge circuit must reduce the time it takes to read the memory array while consuming low amounts of current.

SUMMARY OF THE INVENTION

In accordance with one embodiment of the present invention, it is an object of the present invention to provide an improved precharge circuit.

It is another object of the present invention to provide an improved precharge circuit which is a self timed precharged circuit.

It is another object of the present invention to provide a self-timed precharge circuit that reduces the time it takes to read the memory array while consuming low amounts of current.

BRIEF DESCRIPTION OF THE PREFERRED EMBODIMENTS

In accordance with one embodiment of the present invention, a self timed precharge sense amplifier for allowing high speed reading of a memory cell of a memory array is disclosed. A precharge device is used for generating an output voltage which is used to ramp up a voltage level of a column of the memory array where the memory cell is located. State control circuitry is coupled to the precharge device and is used for activating and deactivating the precharge device. A sense amplifier is coupled to the precharge device and to the state control circuitry for monitoring the output voltage of the precharge device. The sense amplifier is also used for signalling the state control circuitry to deactivate the precharge device when the output voltage has reached a threshold voltage level set by the sense amplifier which is a minimum amount of voltage necessary to properly read the memory cell.

The foregoing and other objects, features, and advantages of the invention will be apparent from the following, more particular, description of the preferred embodiments of the invention, as illustrated in the accompanying drawings.

BRIEF DESCRIPTION OF THE DRAWINGS

FIG. 1 is a simplified functional block diagram of the architecture used for reading and programming a memory cell of a memory array.

FIG. 2 is a simplified electrical schematic of the self timed precharge sense amplifier of the present invention.

DETAILED DESCRIPTION OF THE PREFERRED EMBODIMENTS

Referring to FIG. 1, a prior art system 10, used to read and write to a memory array 12, is shown. In the embodiment depicted in FIG. 1, a row 14R of the memory array 12 is driven by an x-decoder 16 to drive the gate of a memory cell 18 in the memory array 12, or placed as isolated bits. The column 14C is coupled to the drain of the memory cell 18.

In a memory array architecture, a specific column is selected from a number of other memory array columns by the Y-decoder 20. The state of the memory cell (programmed or unprogrammed) is determined by the memory cell current flow. The memory cell current flow is measured in the sense amp 22 which is directly coupled to the Y-decoder 20. In a classic implementation, the row voltage is forced by a row driver (not shown) powered from a semiconductor device power supply. Thus, the row driver generally forces the gate voltage to $V_{DD}$.

The memory cell 18 is read by first decoding the column using the Y-decoder 20. The column is then driven to all the way to a high level $V_{DD}$ by using the sense amplifier 22. The row where the memory cell 18 is located is then driven high by using the X-decoder 16. This takes a finite amount of time due to the number of transistors on the row. The sense amplifier 22 will then detect the memory cell 18 pulling the column to a low level. As stated above, the reading of the memory cell 18 is controlled with clock circuitry which causes the sense amplifier 22 and the X-decoder 16 to run out of sync with one another such that when one is on, the other is off. This waste alot of time since after the memory cell 18 is precharged, the memory cell 18 waits until the read signal is activated. Furthermore, the present system consumes alot of power since the memory cell 18 must be charged all the way to a high level of $V_{DD}$ prior to being read.

Referring to FIG. 2 the self timed precharge sense amplifier 30 of the present invention is shown. The self timed precharge sense amplifier 30 solves all of the problems discussed above by allowing high speed reading of a memory cell 32 while consuming less power by not requiring the memory cell 32 to be precharged all the way to a high level of $V_{DD}$ prior to being read.

In the self timed precharge sense amplifier 30, in order to obtain faster reads, an X-decoder 16 is active all the time. This eliminates the time it takes for the X-decoder 34 to drive the row 36R since the self timed precharge sense amplifier 30 does not have to wait for the X-decoder 34 to turn on and drive the row 36R.

The self timed precharge sense amplifier 30 starts by preselecting the row and column using the X-decode 34 and the Y-decode 38. During this time the nodes 42 and 44 are both at ground potential. When the signal at the input terminal 40 goes high, a read of the memory cell 32 is indicated. The state control circuit 46 will send a signal to a precharge transistor 48 which activates the precharge transistor 48.

In the embodiment shown in FIG. 2, the state control circuit 46 is comprised of three NAND gates 48, 50, and 52. The NAND gates are coupled together such that the first NAND gate 48 has a first input coupled to the input terminal 40 of the self timed precharge sense amplifier 30. The input terminal 40 receives a signal which indicates when the memory cell 32 is to be read. A second input of the first NAND gate 48 is coupled to an output of the second NAND gate 50. The output of the first NAND gate 48 is coupled to the precharge transistor 54 and is used to active and deactivate the precharge transistor 54. The second NAND gate 50 has a first input coupled to the input terminal 40 and a second input coupled to the output of the third NAND gate 52. As stated above, the output of the second NAND gate 50 is coupled to the second input of the first NAND gate 48. The output of the second NAND gate 50 is also coupled to a first input of the third NAND gate 52. The third NAND gate 52 has a first input coupled to the output of the second NAND gate and a second input coupled to the output 54 of the self timed precharge sense amplifier 30 which signals the state control circuit 46 to deactivate the precharge transistor 54. As stated above, the output of the third NAND gate 52 is coupled to the second input of the second NAND gate 50.

When the input at the input terminal 40 is low, the voltage at nodes 44 and 42 are at ground potential. Thus, the output of the first NAND gate 48 is high which keeps the precharge transistor 54 inactive. When the signal at the input terminal 40 goes high to indicate a read of the memory cell 32, the output of the first NAND gate changes from a high state to a low state. The low output signal activates the precharge transistor 54 and the voltage at node 44 begins to ramp up towards $V_{DD}$.

If the memory array which houses the memory cell 32 is a drain voltage sensitive memory array (i.e., EPROM, EEPROM, etc.), a biasing device 48 is required to control the operating voltage of the drain voltage sensitive memory array. In the embodiment shown in FIG. 2, a transistor is used as the biasing device 48. The transistor biasing device 48 has drain, gate, and source terminals. The drain terminal is coupled to the precharge transistor 54. The gate terminal of the transistor biasing device 48 is coupled to a bias voltage source $V_{BIAS}$ while the source terminal is coupled to the memory cell 32 through the transistor 70 which is activated by the Y-decide 38.

As stated above, a low output signal from the NAND gate 48 activates the precharge transistor 54 and the voltage at node 44 begins to ramp up towards $V_{DD}$. If the transistor biasing device 48 is present in the self timed precharge sense amplifier 30, when the precharge transistor 54 is active, the voltage at node 42 begins to ramp up towards $V_{BIAS}$.

A sensing amplifier 56 is coupled to the precharge transistor 54, the transistor biasing device 48, and the memory cell 32. The sensing amplifier 56 is used for monitoring the output voltage of the precharge transistor 54 and for signalling the state control circuit 46 to deactivate the precharge transistor 54 when the output voltage of the precharge transistor 54 has reached a minimum voltage level to properly read the memory cell 32. This allows the self timed precharge sense amplifier 30 to read the memory cell 32 at a faster level than prior art approaches, while consuming less power, since the memory cell 32 does not need to be pre-charged all the way to a high level of $V_{DD}$ prior to being read.

The actual minimum voltage level is determined by the two transistors that make up the sensing amplifier 56. The sensing amplifier has a first transistor 58 which has drain, gate, and source terminals. The source terminal of transistor 58 is coupled to a constant voltage source $V_{DD}$. The gate terminal of the first transistor 58 is coupled to the drain terminal of the precharge transistor 54 and the drain terminal of the transistor biasing device 48. The drain terminal of the first transistor 58 is coupled to the drain terminal of the second transistor 60 of the sensing amplifier 56. Like the first transistor 58, the second transistor 60 has drain, gate, and source terminals. As stated above, the drain terminal of the second transistor 60 is coupled to the drain terminal of the first transistor 58. The gate terminal of the second transistor 60 is coupled to the source terminal of the transistor biasing device 48 and to the memory cell 32 through the Y-decoder 38. The source terminal of the second transistor 60 is grounded.

Once the output voltage of the precharge transistor 54 has reached the minimum voltage level to properly read the memory cell 32, the sensing amplifier 56 will generate an output signal which is sent back to the state control circuit 46. The output signal will cause the state control circuit 46 to deactivate the precharge transistor 54. If the memory cell 32 is erased, the nodes 42 and 44 will be pulled back towards ground which will trip the sensing amplifier 56 and switch the output signal. If the memory cell 32 is programmed, a weak transistor 62 will ensure that the voltage level set by the sensing amplifier 54 does not fall below the minimum amount of voltage to properly read the memory cell 32. The weak transistor 62 will continue to pull the voltage at node 44 towards $V_{DD}$, and will pull the voltage at node 42 to a level below the bias voltage $V_{BIAS}$.

A filtering circuit 64 may be coupled between the output of the sensing amplifier 56 and the input to the third NAND gate 52 of the state control circuit 46. The filtering circuit 64 removes noise from the output signal from the sensing amplifier 56. This protects against false signals which may cause the state control circuit 46 to activate or deactivate the precharge device inadvertently. In the embodiment shown in FIG. 2, the filtering circuit 64 is comprised of two inverters 66 and 68.

The self timed precharge sense amplifier 30 is advantageous over prior art approaches since it burns only a very small amount of dynamic current. The self timed precharge sense amplifier 30 is also much faster since the column and nodes 42 and 44 do not have to be precharged all the way to their final voltage before being read. Another advantage of the self timed precharge sense amplifier 30 is that the reading of the memory cell is controlled with one timing signal (i.e., input signal to input terminal 40). This allows the self timed precharge sense amplifier 30 to be used in embedded applications like microcontrollers as well as dedicated memory devices.

While the invention has been particularly shown and described with reference to preferred embodiments thereof, it will be understood by those skilled in the art that the foregoing and other changes in form, and details may be made therein without departing from the spirit and scope of the invention.

What is claimed is:

1. A self timed precharge sense amplifier for allowing high speed reading of a memory cell of a memory array comprising, in combination:

a precharge device for generating an output voltage which is used to ramp up a voltage level of a column of said memory array where said memory cell is located;

state control circuitry coupled to said precharge device for activating and deactivating said precharge device; and a sense amplifier coupled to said precharge device and to said state control circuitry for monitoring said output voltage of said precharge device and for signalling said state control circuitry to deactivate said precharge device when said output voltage has reached a threshold voltage level set by said sense amplifier which is a minimum amount of voltage required to properly read said memory cell.

2. The self timed precharge sense amplifier in accordance with claim 1 further comprising a bleeder device coupled to said precharge device and to said sense amplifier for ensuring said output voltage generated by said precharge device does not float below said threshold voltage level in order to read said memory cell which is programmed.

3. The self timed precharge sense amplifier in accordance with claim 2 further comprising a filtering circuit coupled between said sense amplifier and said state control circuitry for removing noise from an output signal from said sense amplifier which is used for signalling said state control circuitry to deactivate said precharge device when said output voltage has reached said threshold voltage level set by said sense amplifier.

4. The self timed precharge sense amplifier in accordance with claim 2 wherein said memory array is a drain voltage sensitive memory array.

5. The self timed precharge sense amplifier in accordance with claim 4 further comprising a biasing device coupled to said memory cell, said sense amplifier, and to said precharge device for controlling an operating voltage of said drain voltage sensitive memory array.

6. The self timed precharge sense amplifier in accordance with claim 5 wherein said biasing device is a transistor having drain, gate, and source terminals wherein said drain terminal is coupled to said precharge device, said gate terminal is coupled to a bias voltage source, and said source terminal is coupled to said memory cell.

7. The self timed precharge sense amplifier in accordance with claim 6 wherein said sense amplifier comprises:

a p-channel transistor having drain, gate, and source terminals wherein said source terminal of said p-channel transistor is coupled to a bias voltage source, said gate terminal of said p-channel transistor is coupled to said precharge device and said drain terminal of said transistor of said biasing device, and said drain terminal of said p-channel transistor is coupled to an input to said state control circuitry; and an n-channel transistor having drain, gate, and source terminals wherein said drain terminal of said n-channel transistor is coupled to said drain terminal of said p-channel transistor and to said input to said state control circuitry, said gate terminal of said n-channel transistor is coupled to said source terminal of said transistor of said biasing device, and said source terminal of said n-channel device is grounded.

8. The self timed precharge sense amplifier in accordance with claim 1 wherein said state control circuitry comprises:

a first logic gate having a first input coupled to a signal line which indicates when said memory cell is to be read and an output coupled to said precharge device;

a second logic gate having a first input coupled to said signal line which indicates when said memory cell is to be read and an output coupled to a second input of said first logic gate; and a third logic gate having a first input coupled to said output of said second logic gate, a second input coupled to an output of said sense amplifier which signals said state control circuitry to deactivate said precharge device when said output voltage has reached said threshold voltage level set by said sense amplifier, and an output coupled to a second input of said second logic gate.

9. The self timed precharge sense amplifier in accordance with claim 8 wherein said first logic gate, said second logic gate, and said third logic gate are all NAND gates.

10. A self timed precharge sense amplifier for allowing high speed reading of a memory cell of a memory array comprising, in combination:

a precharge device for generating an output voltage which is used to ramp up a voltage level of a column of said memory array where said memory cell is located;

state control circuitry coupled to said precharge device for activating and deactivating said precharge device, said state control circuitry comprising:

a first NAND gate having a first input coupled to a signal line which indicates when said memory cell is to be read and an output coupled to said precharge device;

a second NAND gate having a first input coupled to said signal line which indicates when said memory cell is to be read and an output coupled to a second input of said first NAND gate; and a third NAND gate having a first input coupled to said output of said second NAND gate, a second input coupled to an output of a sense amplifier which signals said state control circuitry to deactivate said precharge device when said output voltage has reached said threshold voltage level set by said sense amplifier, and an output coupled to a second input of said second NAND gate;

a sense amplifier coupled to said precharge device and to said state control circuitry for monitoring said output voltage of said precharge device and for signalling said state control circuitry to deactivate said precharge device when said output voltage has reached a threshold voltage level set by said sense amplifier which is a minimum amount of voltage required to properly read said memory cell, said sense amplifier comprising:

a p-channel transistor having drain, gate, and source terminals wherein said source terminal of said p-channel transistor is coupled to a bias voltage source, said gate terminal of said p-channel transistor is coupled to said precharge device and to a biasing device, and said drain terminal of said p-channel transistor is coupled to an input to said state control circuitry; and an n-channel transistor having drain, gate, and source terminals wherein said drain terminal of said n-channel transistor is coupled to said drain terminal of said p-channel transistor and to said input to said state control circuitry, said gate terminal of said n-channel transistor is coupled to said biasing device, and said source terminal of said n-channel device is grounded;

a biasing device coupled to said precharge device, said sense amplifier, and to said memory cell for controlling an operating voltage of said drain voltage sensitive memory array; and a bleeder device coupled to said precharge device and to said sense amplifier for ensuring said output voltage generated by said precharged device does not float below said threshold voltage level in order to read said memory cell when said memory cell is programmed.

11. The self timed precharge sense amplifier in accordance with claim 10 further comprising a filtering circuit coupled between said sense amplifier and said state control circuitry for removing noise from an output signal from said sense amplifier which is used for signalling said state control circuitry to deactivate said precharge device when said output voltage has reached said threshold voltage level set by said sense amplifier.

12. The self timed precharge sense amplifier in accordance with claim 11 wherein said memory array is a drain voltage sensitive memory array.

13. The self timed precharge sense amplifier in accordance with claim 12 wherein said biasing device is a transistor having drain, gate, and source terminals wherein said drain terminal is coupled to said precharge device, gate terminal is coupled to a bias voltage source, and said source terminal is coupled to said memory cell.

14. A self timed precharge sense amplifier for allowing high speed reading of a memory cell of a drain voltage sensitive memory array comprising, in combination:

precharge device for generating an output voltage which is used to ramp up a voltage level of a column of said drain voltage sensitive memory array where said memory cell is located;

state control circuitry coupled to said precharge device for activating and deactivating said precharge device;

sense amplifier coupled to said precharge device and to said state control circuitry for monitoring said output voltage of said precharge device and for signalling said state control circuitry to deactivate said precharge device when said output voltage has reached a threshold voltage level set by said sense amplifier which is a minimum amount of voltage to properly read said memory cell;

a bleeder device coupled to said precharge device and to said sense amplifier for ensuring said output voltage generated by said precharge device does not float below said threshold voltage level in order to read said memory cell which is programmed; and biasing device coupled to said precharge device, said sense amplifier, and to said memory cell for controlling an operating voltage of said drain voltage sensitive memory array, wherein said biasing device is a transistor having drain, gate, and source terminals wherein said drain terminal is coupled to said precharge device, said gate terminal is coupled to a bias voltage source, and said source terminal is coupled to said memory cell.

15. A self timed precharge sense amplifier in accordance with claim 14 further comprising a filtering circuit coupled between said sense amplifier and said state control circuitry for removing noise from an output signal from said sense amplifier which is used for signalling said state control circuitry to deactivate said precharge device when said output voltage has reached said threshold voltage level set by said sense amplifier.

16. A self timed precharge sense amplifier in accordance with claim 14 wherein said sense amplifier comprises:

a p-channel transistor having drain, gate, and source terminals wherein said source terminal of said p-channel transistor is coupled to a bias voltage source, said gate terminal of said p-channel transistor is coupled to said precharge device and said drain terminal of said transistor of said biasing device, and said drain terminal of said p-channel transistor is coupled to an input to said state control circuitry; and an n-channel transistor having drain, gate, and source terminals wherein said drain terminal of said n-channel transistor is coupled to said drain terminal of said p-channel transistor and to said input to said state control circuitry, said gate terminal of said n-channel transistor is coupled to said source terminal of said transistor of said biasing device, and said source terminal of said n-channel device is grounded.

17. A self timed precharge sense amplifier in accordance with claim 14 wherein said state control circuitry comprises:

a first logic gate having a first input coupled to a signal line which indicates when said memory cell is to be read and an output coupled to said precharge device;

a second logic gate having a first input coupled to said signal line which indicates when said memory cell is to be read and an output coupled to a second input of said first logic gate; and a third logic gate having a first input coupled to said output of said second logic gate, a second input coupled to an output of said sense amplifier which signals said state control circuitry to deactivate said precharge device when said output voltage has reached said threshold voltage level set by said sense amplifier, and an output coupled to a second input of said second logic gate.

18. A self timed precharge sense amplifier in accordance with claim 16 wherein said first logic gate, said second logic gate, and said third logic gate are all NAND gates.

* * * * *